(12) United States Patent
McAlonis et al.

(10) Patent No.: US 7,553,163 B2
(45) Date of Patent: Jun. 30, 2009

(54) COPLANAR ANGLE MATE STRADDLE MOUNT CONNECTOR

(75) Inventors: Matthew Richard McAlonis, Elizabethtown, PA (US); Lynn Robert Sipe, Mifflintown, PA (US); James Lee Fedder, Etters, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/827,268

(22) Filed: Jul. 11, 2007

(65) Prior Publication Data

US 2009/0017664 A1 Jan. 15, 2009

(51) Int. Cl.
*H01R 12/00* (2006.01)
(52) U.S. Cl. .......................... 439/60; 439/326
(58) Field of Classification Search ............. 439/60–61, 439/326
See application file for complete search history.

(56) References Cited

U.S. PATENT DOCUMENTS

| 5,160,275 | A | 11/1992 | Nakamura et al. |
| 5,425,651 | A | 6/1995 | Thrush et al. |
| 6,027,357 | A | 2/2000 | Howell et al. |
| 6,692,273 | B1 | 2/2004 | Korsunsky et al. |
| 6,767,235 | B2 * | 7/2004 | Wu .............................. 439/328 |
| 6,976,848 | B2 * | 12/2005 | Choi ........................... 439/61 |
| 7,070,420 | B1 | 7/2006 | Wakefield et al. |
| 7,121,839 | B2 | 10/2006 | Rathburn |

FOREIGN PATENT DOCUMENTS

| EP | 262231 | * | 4/1987 |
| EP | 0 633 631 A1 | | 1/1995 |
| GB | 2 242 579 A | | 10/1991 |
| WO | WO 2005/101584 A1 | | 11/1992 |

OTHER PUBLICATIONS

International Search Report, International Application No. PCT/US2008/008403, International Filing Date Sep. 7, 2008.

* cited by examiner

*Primary Examiner*—Truc T Nguyen

(57) ABSTRACT

A straddle mount connector for connecting a daughter card to a circuit board includes a dielectric housing extending along a longitudinal axis. The housing has a daughter card side and an opposite straddle mount side. A longitudinally extending mating slot at the daughter card side is configured to receive a mating edge of the daughter card. A longitudinally extending mounting slot at the straddle mount side is configured to receive a mounting edge of the circuit board. The daughter card is inserted in the mating slot at an acute insertion angle with respect to a plane of the circuit board and rotated to a fully mated position wherein the daughter card is substantially coplanar with the circuit board.

22 Claims, 5 Drawing Sheets

COPLANAR ANGLE MATE STRADDLE MOUNT CONNECTOR

BACKGROUND OF THE INVENTION

The invention relates generally to electrical connectors and, more particularly, to a straddle mount card edge connector that minimizes circuit board space consumed in mating circuit boards in a coplanar arrangement.

The trend toward smaller, lighter, and higher performance electrical components and higher density electrical circuits led to the development of surface mount technology in the design of printed circuit boards. As is well understood in the art, surface mountable packaging allows for the connection of the package to pads on the surface of the circuit board rather than by contacts or pins soldered in plated holes going through the circuit board. Surface mount technology allows for an increased component density on a circuit board, thereby saving space on the circuit board.

However, surface mount technology has become inadequate as electronic devices have become smaller making circuit board space even more limited. For example, large system servers are being replaced by smaller blade servers that include a chassis having multiple slots that receive modules or blades that provide a particular resource. Pluggable modules facilitate maintenance and upgrades in the blade server wherein modules may be unplugged and replacement modules plugged in. Circuit board space is at a premium in blade servers. In addition, due to space limitations, component heights must be kept small. Straddle mount card edge connectors mounted at the edge of the circuit board occupy a reduced amount of space on the circuit boards and offer a low profile height. However, when straddle mount connectors are used to connect circuit boards in a coplanar relationship, some circuit board space is still rendered unusable or consumed by the mating space required to insert the card into the card slot of the connector.

A need exists for a straddle mount card edge connector that maintains a low profile height while minimizing the mating space on the circuit board that is consumed when a card is inserted into the slot of the straddle mount card edge connector.

BRIEF DESCRIPTION OF THE INVENTION

In one embodiment, a straddle mount connector for connecting a daughter card to a circuit board is provided. The straddle mount connector includes a dielectric housing extending along a longitudinal axis. The housing has a daughter card side and an opposite straddle mount side. A longitudinally extending mating slot at the daughter card side is configured to receive a mating edge of the daughter card. A longitudinally extending mounting slot at the straddle mount side is configured to receive a mounting edge of the circuit board. The daughter card is inserted in the mating slot at an acute insertion angle with respect to a plane of the circuit board and rotated to a fully mated position wherein the daughter card is substantially coplanar with the circuit board.

Optionally, the connector straddles edges of the circuit board and the daughter card. The housing includes a pedestal having a surface that establishes the daughter card insertion angle. The pedestal is configured to be received in an aperture in the daughter card to hold the daughter card in the connector. The housing includes a mounting ear configured to receive a fastener to mechanically attach the connector to the circuit board. The housing also includes a tab and an edge of the circuit board is configured to be received between the mounting ear and the tab. A plurality of contacts are held in the housing and arranged in an upper row along an upper side of the mounting slot and an opposite lower row along a lower side of the mounting slot. The upper row of contacts includes contact tails configured to be mounted on an upper surface of the circuit board and the lower row of contacts includes contact tails configured to be mounted on an opposite lower surface of the circuit board. The contacts include mating ends proximate the daughter card side wherein the mating ends of the lower contact row are staggered with respect to the mating ends of the upper contact row. The housing includes crush ribs at the straddle mount side to vertically center the circuit board between the upper and lower contact rows in the housing.

In another embodiment, an electronic assembly is provided. The assembly includes a first circuit board, a second circuit board positioned above the first circuit board, and a daughter card. A straddle mount connector electrically connects the daughter card to the second circuit board. The straddle mount connector includes a dielectric housing extending along a longitudinal axis. The housing has a daughter card side and an opposite straddle mount side. A longitudinally extending mating slot at the daughter card side is configured to receive a mating edge of the daughter card. A longitudinally extending mounting slot at the straddle mount side is configured to receive a mounting edge of the circuit board. The daughter card is inserted in the mating slot at an acute insertion angle with respect to a plane of the second circuit board and rotated to a fully mated position wherein the daughter card is substantially coplanar with the second circuit board.

DETAILED DESCRIPTION OF THE INVENTION

Figure 1:
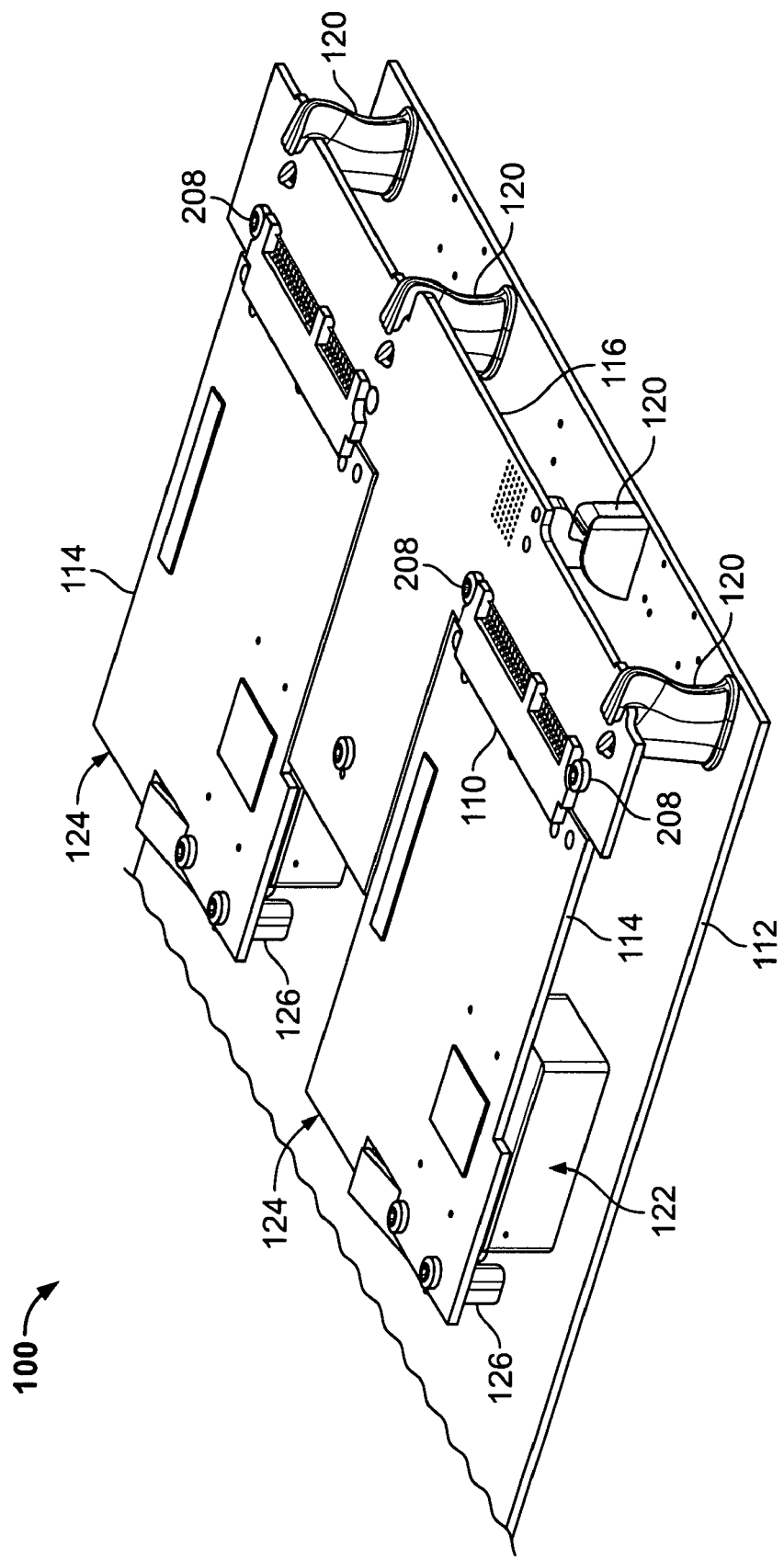
FIG. 1 is a perspective view of an electronic assembly including a straddle mount connector formed in accordance with an exemplary embodiment of the present invention.

FIG. 1 illustrates an electronic assembly 100 including straddle mount connectors 110 formed in accordance with an exemplary embodiment of the present invention. The assembly 100 includes a first circuit board or motherboard 112 and daughter cards 114. The daughter cards 114 are electrically connected to a second circuit board or interposer board 116 using the straddle mount connectors 110. The interposer board 116 is mechanically attached to the motherboard 112 with standoffs 120. The motherboard 112 and daughter cards 114 may include electrical components (not shown) to enable the assembly 100 to perform certain functions. For purposes of illustration only, the assembly 100 may be a blade for use in a blade server, in which case the interposer board 116 would include connectors (not shown) that mate to a backplane (not shown). It is to be understood, however, that other applications of the inventive concepts herein are also contemplated. For instance, the inventive concepts presented herein may be applied to any electrical assembly wherein it is desired to minimize the space rendered unusable on a circuit board such as the motherboard 112 by the mating space required to mount a daughter card that is spaced above the motherboard, such as the daughter card 114, into a card slot of a card edge connector, as will be described. In the illustrated assembly 100, mezzanine connector assemblies 122 are provided to electrically connect the motherboard 112 directly to the daughter cards 114 to enable communication directly between the motherboard 112 and the daughter cards 114. In some embodiments, rearward ends 124 of the daughter cards 114 may be secured to support posts 126 attached to the motherboard 112.

Figure 2:
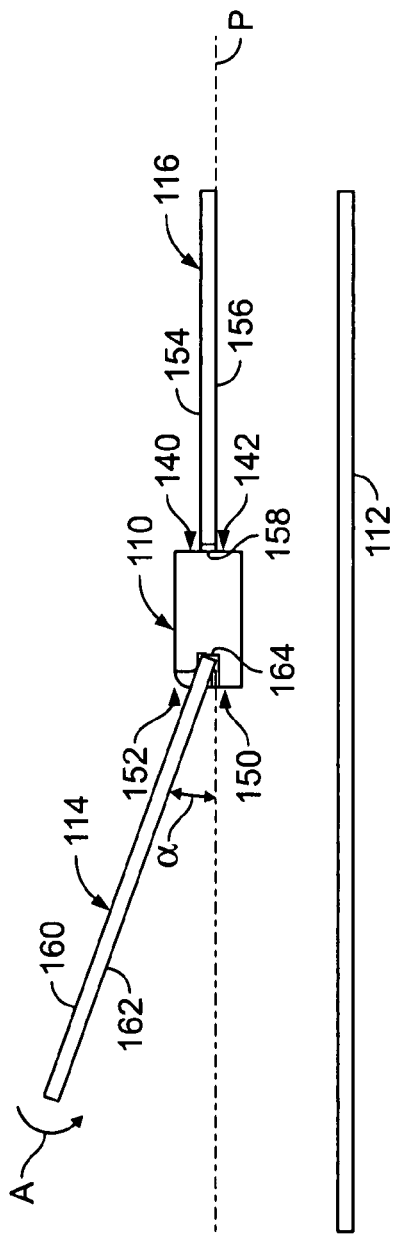
FIG. 2 is a schematic side view of a daughter card partially mated with a straddle mount connector on a circuit board.

FIG. 2 illustrates a schematic side view of the daughter card 114 partially mated with a straddle mount connector 110 on the interposer board 116.

Figure 3:
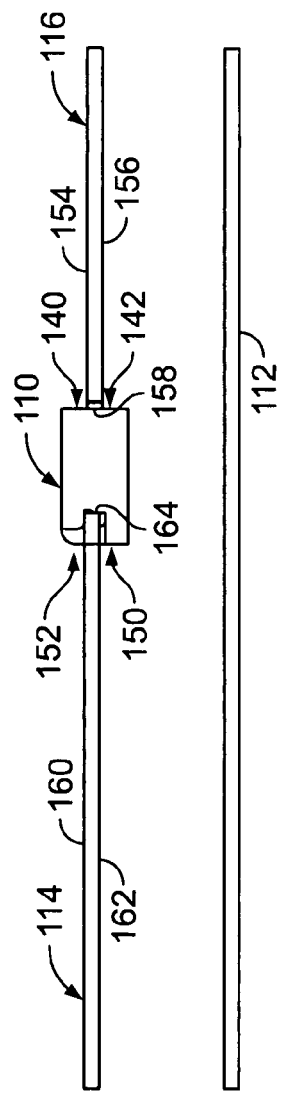
FIG. 3 is a schematic side view of the daughter card shown in FIG. 2 in a fully mated condition with the straddle mount connector.

FIG. 3 illustrates a schematic side view of the daughter card 114 in a fully mated position with the straddle mount connector 110. The connector 110 includes a straddle mount side 140 that defines a mounting interface 142. The mounting interface 142 is a non-separable interface. A daughter card side 150 is opposite the straddle mount side 140 and defines a separable daughter card interface 152. The interposer board 116 includes an upper surface 154, an opposite lower surface 156, and a mounting edge 158 therebetween. The daughter card 114 includes an upper surface 160, an opposite lower surface 162, and a mating edge 164 therebetween.

When the daughter card 114 is mated with the connector 110, the daughter card 114 is inserted into the connector 110 at an acute insertion angle α with respect to a plane P of the interposer board 116. The daughter card 114 is then rotated in the direction of the arrow A to the fully mated position shown in FIG. 3. In the fully mated position, the daughter card 114 is substantially coplanar with the interposer board 116. In an exemplary embodiment, the daughter card 114, when fully mated, is also substantially parallel to the motherboard 112. Rotation of the daughter card 114 in the direction of the arrow A enables mating of the mezzanine connector assembly 122 (FIG. 1). Furthermore, mating and unmating of the daughter card 114 with the connector 110 does not require the daughter card 114 to be moved parallel to the motherboard 112 in the directions of the double arrow B, so that no space on the motherboard 112 is consumed or rendered unusable by mating and unmating of the daughter card 114 with the connector 110. In an exemplary embodiment, insertion angle α is about twenty degrees.

The straddle mount connector 110 straddles edges 158 and 164 of the interposer board 116 and the daughter card 114 respectively so that the height of the connector 110 is distributed on both the upper and lower sides of the interposer board 116 and daughter card 114 which lowers the profile height of the assembly 100.

Figure 4:
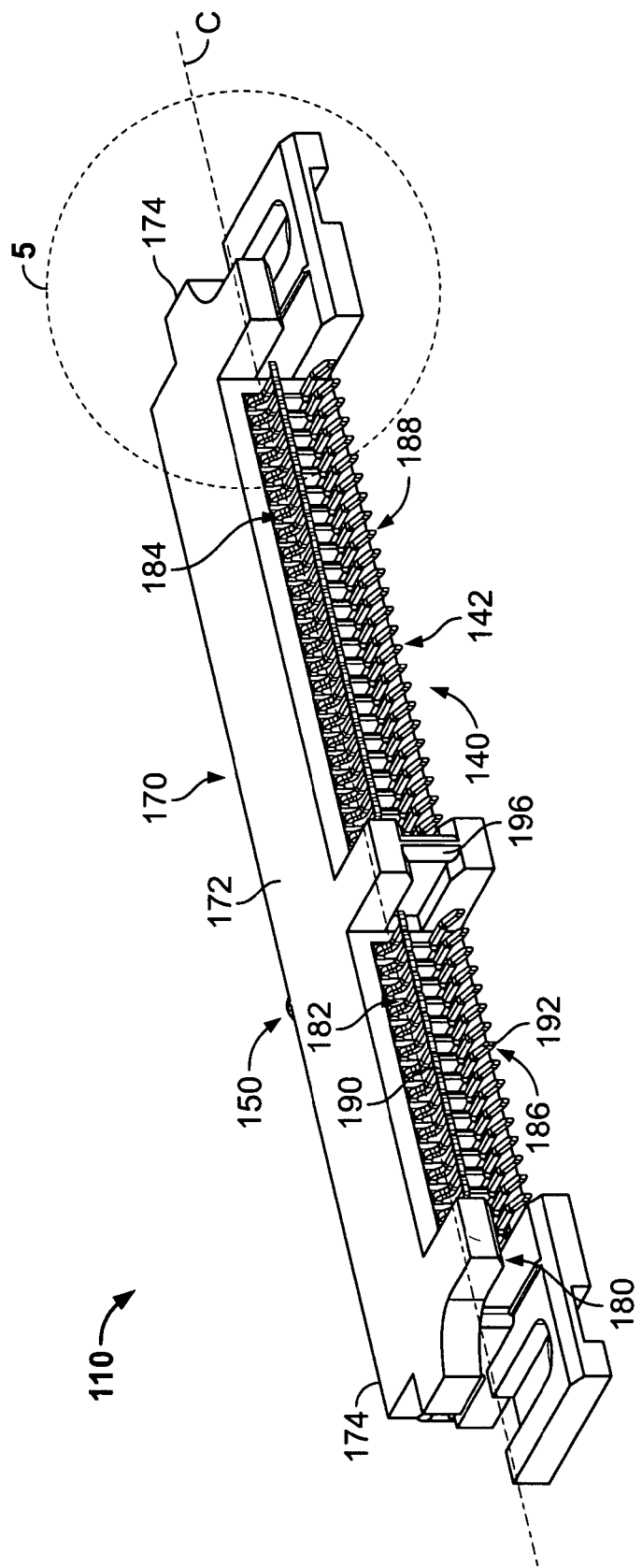
FIG. 4 is a perspective view of the straddle mount connector shown in FIG. 1 taken from the straddle mount side.
Figure 5:
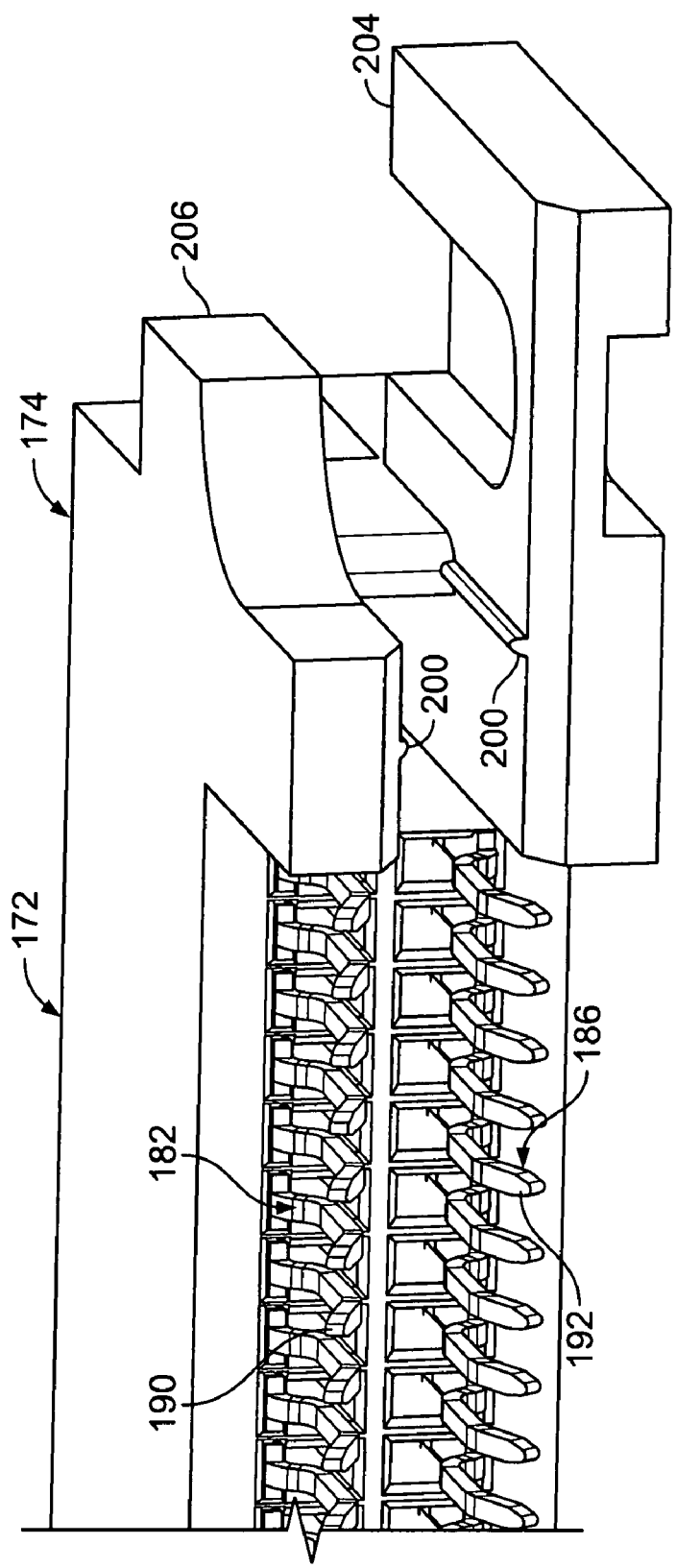
FIG. 5 is an enlarged fragmentary view of a portion of the housing of the straddle mount connector shown in FIG. 4.

FIG. 4 illustrates a perspective view of the straddle mount connector 110 taken from the straddle mount side 140. FIG. 5 illustrates an enlarged fragmentary view of a portion of the connector 110. The connector 110 includes a dielectric housing 170 having a body 172 that extends along a longitudinal axis C between opposed ends 174. A longitudinally extending mounting slot 180 is configured to receive the edge 158 (FIG. 3) of the interposer board 116 so that the straddle mount side 140 of the connector 110 straddles the edge 158 of the interposer board 116. The housing body 172 holds a plurality of electrical contacts 182 arranged in an upper row 184 along an upper side of the slot 180. A plurality of electrical contacts 186 are arranged in a lower row 188 along an opposite lower side of the slot 180. The upper row 184 of contacts 182 include contact tails 190 that are configured to be electrically connected to contact pads (not shown) on the upper surface 154 (FIG. 3) of the interposer board 116. The lower row 188 of contacts 186 include contact tails 192 that are configured to be electrically connected to contact pads (not shown) on the lower surface 156 (FIG. 3) of the interposer board 116. In an exemplary embodiment, the contact tails 190 and 192 are soldered to the contact pads on the interposer board 116 thereby rendering the interface 142 a non-separable interface. The housing body 172 includes an alignment key 196 on the straddle mount side 140 to align the connector 110 with respect to the interposer board 116. More specifically, the alignment key 196 positions the housing 170 on the interposer board 116 to accurately register the contact tails 190 and 192 with respective contact pads (not shown) on the interposer board 116. The interposer board 116 includes a slot (not shown) that is configured to receive the alignment key 196.

Crush ribs 200 are provided on each end 174 of the housing 170 to assist in vertically centering the interposer board 116 between the contact rows 184 and 188 in the housing body 172. Each end 174 also includes a mounting ear 204 and a tab 206. When the connector 110 is mounted on the interposer board 116, a portion of the edge 158 is received between the mounting ear 204 and the tab 206. In an exemplary embodiment, the mounting ear 204 is configured to receive a fastener 208 (see FIG. 1) to mechanically join the interposer board 116 to the connector 110. The mounting ears 204 provide additional mechanical support to withstand torsional loads associated with rotational mating of the daughter cards 114 which would otherwise be transmitted to the solder joints between the contact tails 190, 192 and the contact pads (not shown) on the interposer board 116.

Figure 6:
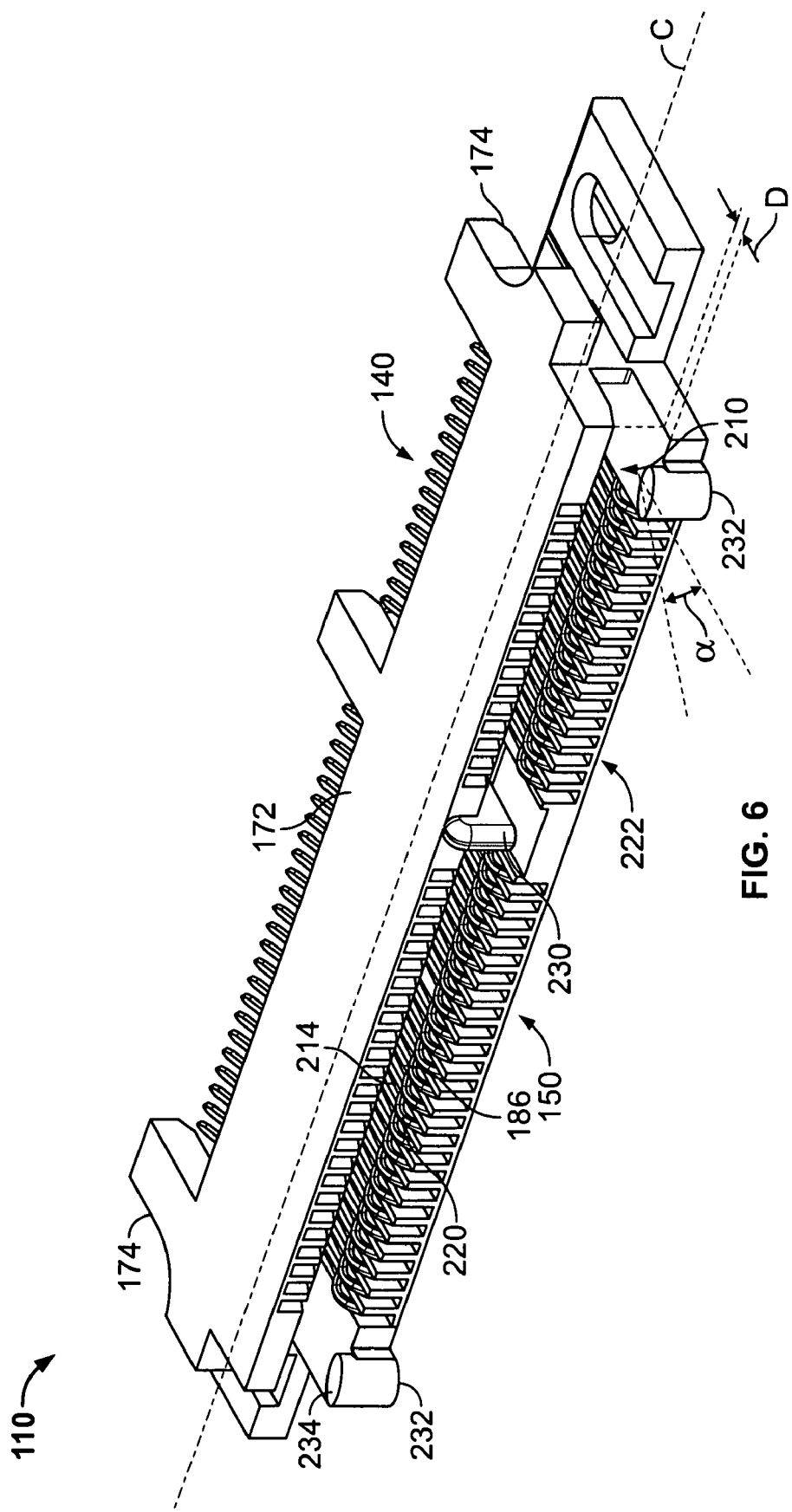
FIG. 6 is a perspective view of the straddle mount connector shown in FIG. 1 taken from the daughter card side.

FIG. 6 illustrates a perspective view of the straddle mount connector 110 taken from the daughter card side 150. At the daughter card side 150, the housing body 172 includes a longitudinally extending mating slot 210 that is configured to receive a mating edge 164 (FIG. 3) of the daughter card 114. The contacts 182 (FIG. 4) and 186 extend through the housing body 172. The contacts 182 have mating ends 214 arranged in an upper contact row 216 along an upper side of the mating slot 210. The contacts 186 have mating ends 220 arranged in a lower contact row 222 along a lower side of the mating slot 210. The contacts 186 in the lower contact row 222 have longer mid-sections (not shown) that result in the mating ends 220 of the contacts 186 being staggered a distance D from the mating ends 214 in the upper contact row 216. During mating of the daughter card 114 (FIG. 2) with the connector 110, the mating edge 164 (FIG. 2) of the daughter card 114 engages and deflects the contact mating ends 220 in the lower contact row 222 prior to engaging the mating ends 214 in the upper contact row 216 such that the initial insertion force for mating the daughter card 114 is reduced.

The housing body 172 includes an alignment key 230 on the daughter card side 150 to position and align the daughter card 114 within the mating slot 210 to register the contact mating ends 214 and 220 to contact pads (not shown) on the daughter card 114. The daughter card 114 includes a slot (not shown) that is configured to receive the alignment key 230. Each end 174 of the housing 170 includes a pedestal 232 proximate the lower contact row 222. The pedestal 232 has a beveled upper surface 234 that establishes the insertion angle α. When the daughter card 114 is mated with the connector 110, the surfaces 234 on the pedestals 232 engage the daughter card 114 to guide the daughter card 114 into mating slot 210 at the prescribed insertion angle α. The pedestals 232 are configured to be received in apertures (not shown) in the daughter card 114 as the daughter card 114 is rotated to the fully mated position. When received in the apertures in the daughter card 114, the pedestals 232 hold the daughter card 114 to insure that the daughter card 114 does not back out of the connector 110.

The embodiments thus described provide a straddle mount card edge connector that minimizes unusable space on a motherboard that has a daughter card mounted to a circuit board such as an interposer board above the motherboard. The daughter card is mated to the straddle mount connector using a rotating angular motion to move the daughter card to a final mated position. The connector facilitates mating of circuit boards in a coplanar arrangement and supports system modularity while maintaining high speed electrical performance. The straddle mount connector straddles edges of the circuit board and the daughter card so that the height of the connector is distributed on both the upper and lower sides of the circuit board and daughter card which lowers the profile height of an electronic assembly.

While the invention has been described in terms of various specific embodiments, those skilled in the art will recognize that the invention can be practiced with modification within the spirit and scope of the claims.

What is claimed is:

1. A straddle mount connector for connecting a daughter card to a circuit board, said straddle mount connector comprising:
   a dielectric housing extending along a longitudinal axis, said housing having a daughter card side and an opposite straddle mount side, a longitudinally extending mating slot at said daughter card side is configured to receive a mating edge of the daughter card, and a longitudinally extending mounting slot at said straddle mount side is configured to receive a mounting edge of the circuit board, said housing comprising a pedestal that is configured to be received in an aperture in the daughter card to hold the daughter card in the connector; and
   wherein the daughter card is inserted in said mating slot at an acute insertion angle with respect to a plane of the circuit board and rotated to a fully mated position wherein the daughter card is substantially coplanar with the circuit board.

2. The straddle mount connector of claim 1 further comprising a plurality of contacts held in said housing and arranged in an upper row along an upper side of said mounting slot and an opposite lower row along a lower side of said mounting slot, said upper row of contacts including contact tails configured to be mounted on an upper surface of the circuit board and said lower row of contacts including contact tails configured to be mounted on an opposite lower surface of the circuit board.

3. The straddle mount connector of claim 1, wherein the pedestal has a surface that establishes the daughter card insertion angle.

4. The straddle mount connector of claim 1, wherein said housing includes a key at said daughter card side to position and align the daughter card in said mating slot.

5. The straddle mount connector of claim 1, wherein said housing includes a mounting ear configured to receive a fastener to mechanically attach the connector to the circuit board.

6. The straddle mount connector of claim 1, wherein said housing includes a mounting ear and a tab, said mounting ear and tab being spaced-apart from one another and configured to receive an edge of the circuit board therebetween.

7. The straddle mount connector of claim 1, wherein said housing includes an alignment key proximate said mounting end to align the connector with respect to the circuit board.

8. The straddle mount connector of claim 1, wherein said housing includes crush ribs at said straddle mount side to vertically center the circuit board between the upper and lower contact rows at said straddle mount side of said housing.

9. The straddle mount connector of claim 1, wherein the pedestal comprises a beveled surface that establishes the daughter card insertion angle.

10. The straddle mount connector of claim 1, wherein the daughter card insertion angle is greater than zero degrees.

11. The straddle mount connector of claim 2, wherein the contacts include mating ends proximate said daughter card side and wherein the mating ends of the lower contact row are staggered with respect to the mating ends of the upper contact row.

12. An electronic assembly comprising:
   a first circuit board;
   a second circuit board positioned above said first circuit board;
   a daughter card; and
   a straddle mount connector for electrically connecting said daughter card to said second circuit board, said straddle mount connector comprising:
      a dielectric housing extending along a longitudinal axis, said housing having a daughter card side and an opposite straddle mount side, a longitudinally extending mating slot at said daughter card side is configured to receive a mating edge of said daughter card, and a longitudinally extending mounting slot at said straddle mount side is configured to receive a mounting edge of said second circuit board, the housing comprising a pedestal having a surface that establishes an acute insertion angle of the daughter card; and
   wherein the daughter card is inserted in said mating slot at the acute insertion angle with respect to a plane of the second circuit board and rotated to a fully mated position wherein the daughter card is substantially coplanar with the second circuit board.

13. The electronic assembly of claim 12 further comprising a mezzanine connector assembly for electrically connecting said daughter card to said first circuit board.

14. The electronic assembly of claim 12, wherein said daughter card is substantially parallel to said first circuit board when said daughter card is in the fully mated position.

15. The electronic assembly of claim 12 further comprising a plurality of contacts held in said housing and arranged in an upper row along an upper side of said mounting slot and an opposite lower row along a lower side of said mounting slot, said upper row of contacts including contact tails configured to be mounted on an upper surface of the second circuit board and said lower row of contacts including contact tails configured to be mounted on an opposite lower surface of the second circuit board.

16. The electronic assembly of claim 12, wherein the pedestal is configured to be received in an aperture in the daughter card to hold the daughter card in the connector.

17. The electronic assembly of claim 12, wherein said housing includes a mounting ear configured to receive a fastener to mechanically attach the connector to the second circuit board.

18. The electronic assembly of claim 12, wherein said housing includes a mounting ear and a tab, and a portion of an edge of the second circuit board is configured to be received between said mounting ear and said tab.

19. The electronic assembly of claim 12, wherein said housing includes crush ribs at said straddle mount side to vertically center the second circuit board between the upper and lower contact rows at said straddle mount side of said housing.

20. The electronic assembly of claim 12, wherein the acute insertion angle is greater than zero degrees with respect to a plane of the second circuit board.

21. The electronic assembly of claim 15, wherein the contacts include mating ends proximate said daughter card side and wherein the mating ends of the lower contact row are staggered with respect to the mating ends of the upper contact row.

22. The electronic assembly of claim 12, wherein the surface of the pedestal is a beveled surface.

* * * * *